United States Patent
Sakurai et al.

(10) Patent No.: US 11,623,935 B2
(45) Date of Patent: Apr. 11, 2023

(54) RAW MATERIAL FOR FORMING THIN FILM BY ATOMIC LAYER DEPOSITION METHOD, METHOD OF PRODUCING THIN FILM, AND ALKOXIDE COMPOUND

(71) Applicant: ADEKA CORPORATION, Tokyo (JP)

(72) Inventors: Atsushi Sakurai, Tokyo (JP); Masako Hatase, Tokyo (JP); Tomoharu Yoshino, Tokyo (JP); Akihiro Nishida, Tokyo (JP); Atsushi Yamashita, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 0 days.

(21) Appl. No.: 17/312,637

(22) PCT Filed: Dec. 3, 2019

(86) PCT No.: PCT/JP2019/047199
§ 371 (c)(1),
(2) Date: Jun. 10, 2021

(87) PCT Pub. No.: WO2020/129616
PCT Pub. Date: Jun. 25, 2020

(65) Prior Publication Data
US 2022/0024953 A1    Jan. 27, 2022

(30) Foreign Application Priority Data
Dec. 17, 2018    (JP) .............. JP2018-235182

(51) Int. Cl.
*C23C 16/18*    (2006.01)
*C23C 16/455*    (2006.01)
*C07F 7/22*    (2006.01)

(52) U.S. Cl.
CPC ............ *C07F 7/2224* (2013.01); *C23C 16/18* (2013.01); *C23C 16/45553* (2013.01)

(58) Field of Classification Search
CPC .............. C23C 16/18; C23C 16/45525; C23C 16/45553; C07F 7/2224
See application file for complete search history.

(56) References Cited

U.S. PATENT DOCUMENTS

| | | | |
|---|---|---|---|
| 2008/0085365 A1 | 4/2008 | Yamada et al. | |
| 2009/0275770 A1* | 11/2009 | Kim | C07F 7/2204 556/87 |
| 2017/0050998 A1* | 2/2017 | Yoshino | C23C 16/44 |

FOREIGN PATENT DOCUMENTS

| | | |
|---|---|---|
| EP | 3 677 585 | 7/2020 |
| JP | 2009-227674 | 10/2009 |
| WO | 2005/063685 | 7/2005 |

OTHER PUBLICATIONS

International Search Report dated Feb. 10, 2020 in International (PCT) Application No. PCT/JP2019/047199.

(Continued)

*Primary Examiner* — Elizabeth A Burkhart
(74) *Attorney, Agent, or Firm* — Wenderoth, Lind & Ponack, L.L.P.

(57) ABSTRACT

Provided is a thin-film forming raw material, which is used in an atomic layer deposition method, including an alkoxide compound represented by the following general formula (1):

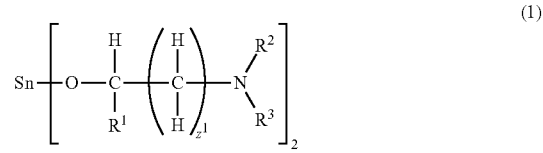

(1)

where $R^1$ represents a hydrogen atom or an alkyl group having 1 to 5 carbon atoms, $R^2$ and $R^3$ each independently (Continued)

represent an alkyl group having 1 to 5 carbon atoms, and $z^1$ represents an integer of from 1 to 3.

2 Claims, 4 Drawing Sheets

(56) References Cited

OTHER PUBLICATIONS

Han et al., "Growth of amorphous zinc tin oxide films using plasma-enhanced atomic layer deposition from bis(1-dimethylamino-2-methyl-2propoxy)tin, diethylzinc, and oxygen plasma", Applied Surface Science, Sep. 8, 2015, vol. 357, pp. 672-677.
Zemlyansky et al., "New Stable Germylenes, Stannylenes, and Related Compounds. 1. Stable Germanium(II) and Tin(II) Compounds $M(OCH_2CH_2NMe_2)_2$(M=Ge, Sn) with Intramolecular Coordination Metal-Nitrogen Bonds. Synthesis and Structure", Organometallics, Mar. 18, 2003, vol. 22, pp. 1675-1681.
Extended European Search Report dated Aug. 10, 2022, in corresponding European Patent Application No. 19899164.8.

* cited by examiner

RAW MATERIAL FOR FORMING THIN FILM BY ATOMIC LAYER DEPOSITION METHOD, METHOD OF PRODUCING THIN FILM, AND ALKOXIDE COMPOUND

TECHNICAL FIELD

The present invention relates to a thin-film forming raw material, which is used in an atomic layer deposition method, containing an alkoxide compound having a specific structure, a method of producing a thin-film, and an alkoxide compound.

BACKGROUND ART

A thin-film containing a tin atom shows specific electrical characteristics. Accordingly, the thin-film containing a tin atom has been applied to various applications including a transparent electrode, a resistance film, and a barrier film.

As a method of producing a thin-film, there are given, for example, a sputtering method, an ion plating method, an MOD method, such as a coating thermal decomposition method and a sol-gel method, and a CVD method. Of those, an atomic layer deposition method (hereinafter sometimes referred to as ALD method) is an optimum production process because the atomic layer deposition method has a number of advantages, such as excellent composition controllability and step coverage, suitability for mass production, and capability of hybrid integration.

Various materials that can be used in vapor phase thin-film formation methods, such as the CVD method and the ALD method, have been reported. A thin-film forming raw material applicable to the ALD method is required to have a sufficiently wide temperature region called an ALD window. Accordingly, it is common general technical knowledge in the art that even a thin-film forming raw material, which can be used in the CVD method, may not be suitable for the ALD method in many cases.

Various tin compounds have been known as tin compounds to be used as raw materials for the CVD method. In, for example, Patent Document 1, there is a disclosure of an aminoalkoxide complex of tin that can be effectively applied to a metal organic chemical vapor deposition method (MOCVD). In Patent Document 1, as specific examples of the aminoalkoxide complex of tin, there are disclosures of (dimethylamino-2-methyl-2-propoxy)tin(II) and (dimethylamino-2-methyl-butoxy)tin(II). In Patent Document 1, there is no disclosure of the use of the aminoalkoxide complex of tin as a raw material for the ALD method.

CITATION LIST

Patent Document

Patent Document 1: JP 2009-227674 A

SUMMARY OF INVENTION

Technical Problem

The thin-film forming raw material, which is used in an atomic layer deposition method, has been required to have a sufficiently wide ALD window, to be excellent in thermal stability, and to be capable of reacting with a reactive gas at low temperature to produce a high-quality thin-film with high productivity. Of such raw materials, a thin-film forming raw material, which is used in an atomic layer deposition method, having a wide ALD window and capable of providing a high-quality thin-film has been strongly required. However, the ALD windows of (dimethylamino-2-methyl-2-propoxy)tin(II) and (dimethylamino-2-methyl-butoxy)tin(II) specifically disclosed in Patent Document 1 are extremely narrow. Accordingly, when any such compound is used as a thin-film forming raw material, which is used in an atomic layer deposition method, it is difficult to control the formation of a thin-film. Even if a thin-film is formed through use of any such compound as a thin-film forming raw material, which is used in an atomic layer deposition method, in a narrow temperature region by the ALD method, a film thickness obtained per cycle becomes smaller. Accordingly, there has been a problem in that even when any such compound is used as a thin-film forming raw material, which is used in an atomic layer deposition method, a film formation rate is slow and a large amount of a residual carbon component is mixed in a thin-film.

Accordingly, an object of the present invention is to provide a thin-film forming raw material, which is used in an atomic layer deposition method, capable of producing a high-quality thin-film containing a tin atom with high productivity, and a method of producing a thin-film including using the raw material.

Solution to Problem

The inventors of the present invention have made investigations, and as a result, have found that the above-mentioned problem can be solved by using a tin compound having a specific structure as a thin-film forming raw material, which is used in an atomic layer deposition method. Thus, the inventors have reached the present invention.

That is, according to one embodiment of the present invention, there is provided a thin-film forming raw material, which is used in an atomic layer deposition method, including an alkoxide compound represented by the following general formula (1):

where $R^1$ represents a hydrogen atom or an alkyl group having 1 to 5 carbon atoms, $R^2$ and $R^3$ each independently represent an alkyl group having 1 to 5 carbon atoms, and $z^1$ represents an integer of from 1 to 3.

According to one embodiment of the present invention, there is provided a method of producing a thin-film containing a tin atom on a surface of a substrate by an atomic layer deposition method, the method including the steps of: vaporizing the thin-film forming raw material, which is used in an atomic layer deposition method, followed by deposition of the raw material on the surface of the substrate to form a precursor thin-film; and causing the precursor thin-film to react with a reactive gas to form the thin-film containing a tin atom on the surface of the substrate.

According to one embodiment of the present invention, there is provided an alkoxide compound represented by the following general formula (2):

(2)

where $R^4$ to $R^6$ each independently represent an alkyl group having 1 to 5 carbon atoms, provided that the total number of carbon atoms of $R^4$ to $R^6$ is from 4 to 8, and $z^2$ represents an integer of from 1 to 3.

Advantageous Effects of Invention

According to the present invention, there can be provided the thin-film forming raw material, which is used in an atomic layer deposition method, having a wide ALD window and capable of producing a high-quality thin-film containing a tin atom with high productivity. In addition, according to the present invention, there can be provided the method of producing a thin-film by which a high-quality thin-film containing a tin atom can be produced with high productivity.

DESCRIPTION OF EMBODIMENTS

A thin-film forming raw material, which is used in an atomic layer deposition method, of the present invention (hereinafter referred to as "thin-film forming raw material of the present invention") is characterized by including an alkoxide compound represented by the general formula (1).

In the general formula (1), $R^1$ represents a hydrogen atom or an alkyl group having 1 to 5 carbon atoms, $R^2$ and $R^3$ each independently represent an alkyl group having 1 to 5 carbon atoms, and $z^1$ represents an integer of from 1 to 3.

In the general formula (1), examples of the alkyl group having 1 to 5 carbon atoms represented by $R^1$ to $R^3$ include a methyl group, an ethyl group, a n-propyl group, an isopropyl group, a n-butyl group, a sec-butyl group, a tert-butyl group, an isobutyl group, a n-pentyl group, a sec-pentyl group, a tert-pentyl group, an isopentyl group, and a neopentyl group.

A preferred combination of $R^1$ to $R^3$ and $z^1$ in the general formula (1) is such that the alkoxide compound is brought into a liquid state under normal temperature and normal pressure, and hence its vapor pressure increases. Specifically, the alkoxide compound in which $R^1$ represents a hydrogen atom is preferred because the compound has a wide ALD window and can provide a thin-film with high productivity. Of such compounds, the alkoxide compound in which $R^1$ represents a hydrogen atom, $R^2$ and $R^3$ each represent a methyl group or an ethyl group, and $z^1$ represents 1 is particularly preferred because the compound has a high vapor pressure and a low melting point. In addition, the alkoxide compound in which $R^1$ represents an alkyl group having 1 to 4 carbon atoms is preferred because the compound has a wide ALD window and can provide a high-quality thin-film containing a small amount of residual carbon. Of such compounds, the alkoxide compound in which $R^1$ represents an alkyl group having 1 to 4 carbon atoms, and $R^2$ and $R^3$ each represent a methyl group, an ethyl group, or an isopropyl group is preferred because the effects above becomes particularly high. In addition, the alkoxide compound in which $R^1$ represents a methyl group, an ethyl group, or an isopropyl group, $R^2$ and $R^3$ each represent a methyl group or an ethyl group, and $z^1$ represents 1 is particularly preferred because the compound has a high vapor pressure and a low melting point.

As preferred specific examples of the alkoxide compound represented by the general formula (1), there are given, for example, the following Compounds No. 1 to No. 12. In Compounds No. 1 to No. 12 below, "Me" represents a methyl group, "Et" represents an ethyl group, and "iPr" represents an isopropyl group.

-continued

Compound No.8

Compound No.9

Compound No.10

Compound No.11

Compound No.12

A method of producing the alkoxide compound represented by the general formula (1) is not particularly limited, and the compound is produced by applying a well-known reaction. A well-known general synthesis method for an alkoxide compound including using a corresponding alcohol may be applied as the method of producing the alkoxide compound represented by the general formula (1). Specific examples of the method of producing the alkoxide compound represented by the general formula (1) include: a method including causing an inorganic salt of tin, such as a halide or a nitrate, or a hydrate thereof and the corresponding alcohol compound to react with each other in the presence of a base, such as sodium, sodium hydride, sodium amide, sodium hydroxide, sodium methylate, ammonia, or an amine; a method including causing an inorganic salt of tin, such as a halide or a nitrate, or a hydrate thereof and an alkali metal alkoxide of the corresponding alcohol compound, such as a sodium alkoxide, a lithium alkoxide, or a potassium alkoxide, to react with each other; a method including subjecting an alkoxide compound of tin and a low-molecular weight alcohol, such as a methoxide, an ethoxide, an isopropoxide, or a butoxide, and the corresponding alcohol compound to an exchange reaction; and a method including causing an inorganic salt of tin, such as a halide or a nitrate, and a derivative that provides a reactive intermediate to react with each other to provide the reactive intermediate, and then causing the reactive intermediate and the corresponding alcohol compound to react with each other. Examples of the reactive intermediate include a bis(dialkylamino)tin, bis(bis(trimethylsilyl)amino)tin, and an amide compound of tin.

It is only required that the thin-film forming raw material of the present invention contain the alkoxide compound represented by the general formula (1), and the composition thereof varies depending on the kind of an intended thin-film. For example, when a thin-film containing only tin as a metal is produced, the thin-film forming raw material, which is used in an atomic layer deposition method, of the present invention is free of a metal compound other than the alkoxide compound represented by the general formula (1) and a semimetal compound. Meanwhile, when a thin-film containing tin and a metal other than tin and/or a semimetal is produced, the thin-film forming raw material of the present invention contains a compound containing a metal other than tin and/or a compound containing a semimetal (hereinafter sometimes referred to as "other precursor") in addition to the alkoxide compound represented by the general formula (1). The thin-film forming raw material of the present invention may further contain an organic solvent and/or a nucleophilic reagent as described later.

[Other Precursor]

In the present invention, the other precursor is a component to be used in the case where a thin-film further containing a metal other than tin and/or silicon is formed on the surface of a substrate, and the kind and content of the other precursor only need to be determined in accordance with, for example, the kind of the metal to be introduced into the thin-film, and the amount of the metal and/or silicon. The other precursor to be used in the thin-film forming raw material of the present invention is not particularly limited, and a well-known general precursor that has been used in a thin-film forming raw material, which is used in an atomic layer deposition method, may be used.

Examples of the other precursor include: a reaction product of an organic compound, such as an alcohol compound, a glycol compound, a β-diketone compound, a cyclopentadiene compound, or an amine compound, and silicon or the metal other than tin; and a compound of the metal using the organic compound as a ligand.

Examples of the kind of the metal in the other precursor include lithium, sodium, potassium, magnesium, calcium, strontium, barium, titanium, zirconium, hafnium, vanadium, niobium, tantalum, chromium, molybdenum, tungsten, manganese, iron, ruthenium, cobalt, rhodium, iridium, nickel, palladium, platinum, copper, silver, gold, zinc, aluminum, indium, germanium, gallium, lead, antimony, bismuth, scandium, ruthenium, yttrium, lanthanum, cerium, praseodymium, neodymium, promethium, samarium, europium, gadolinium, terbium, dysprosium, holmium, erbium, thulium, ytterbium, and lutetium.

Examples of the alcohol compound include: alkyl alcohols, such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether alcohols, such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-s-butoxy-1,1-diethylethanol, and 3-methoxy-1,1-dimethylpropanol; and dialkylamino alcohols, such as dimethylaminoethanol, ethylmethylaminoethanol, diethylaminoethanol, dimethylamino-2-pentanol, ethylmethylamino-2-pentanol, dimethylamino-2-methyl-2-pentanol, ethylmethylamino-2-methyl-2-pentanol, and diethylamino-2-methyl-2-pentanol.

Examples of the glycol compound include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

Examples of the β-diketone compound include: alkyl-substituted β-diketones, such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones, such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketones, such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy)heptane-3,5-dione.

Examples of the cyclopentadiene compound include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclopentadiene, dimethylcyclopentadiene, and tetramethylcyclopentadiene.

Examples of the amine compound include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

The above-mentioned other precursors are known in the art, and production methods therefor are also known. An example of the production methods is given as described below. For example, when the alcohol compound is used as the organic ligand, the precursor may be produced through a reaction between an inorganic salt of the metal described above or a hydrate thereof and an alkali metal alkoxide of the alcohol compound. In this case, examples of the inorganic salt of the metal or the hydrate thereof may include a halide and a nitrate of the metal, and examples of the alkali metal alkoxide may include a sodium alkoxide, a lithium alkoxide, and a potassium alkoxide.

The other precursor is preferably a compound which is similar to the alkoxide compound represented by the general formula (1) in the behavior of thermal decomposition and/or oxidative decomposition, and does not cause alternation through a chemical reaction or the like at the time of mixing.

[Organic Solvent]

The organic solvent is used as a solvent for diluting the alkoxide compound represented by the general formula (1) or the other precursor in a raw material introduction step to be described later. As the organic solvent to be used in the thin-film forming raw material of the present invention, a well-known general organic solvent may be used without particular limitation as long as the solvent does not decompose or alter the alkoxide compound represented by the general formula (1) and the other precursor. Examples of the organic solvent include: acetic acid esters, such as ethyl acetate, butyl acetate, and methoxyethyl acetate; ethers, such as tetrahydrofuran, tetrahydropyran, ethylene glycol dimethyl ether, diethylene glycol dimethyl ether, triethylene glycol dimethyl ether, dibutyl ether, and dioxane; ketones, such as methyl butyl ketone, methyl isobutyl ketone, ethyl butyl ketone, dipropyl ketone, diisobutyl ketone, methyl pentyl ketone, cyclohexanone, and methylcyclohexanone; hydrocarbons, such as hexane, cyclohexane, methylcyclohexane, dimethylcyclohexane, ethylcyclohexane, heptane, octane, toluene, and xylene; hydrocarbons each substituted with a cyano group, such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; pyridine; and lutidine. Those organic solvents may be used alone or in combination thereof in accordance with, for example, the solubility of the solute, the relationship among the use temperature, the boiling point, and the flash point, and the like.

[Nucleophilic Reagent]

The nucleophilic reagent is a component to be blended for the purpose of improving the stability of each of the alkoxide compound represented by the general formula (1) and the other precursor. Examples of the nucleophilic reagent to be used in the thin-film forming raw material of the present invention include: ethylene glycol ethers, such as glyme, diglyme, triglyme, and tetraglyme; crown ethers, such as 18-crown-6, dicyclohexyl-18-crown-6, 24-crown-8, dicyclohexyl-24-crown-8, and dibenzo-24-crown-8; polyamines, such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, and triethoxytriethyleneamine; cyclic polyamines, such as cyclam and cyclen; heterocyclic compounds, such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, and oxathiolane; β-ketoesters, such as methyl acetoacetate, ethyl acetoacetate, 2-methoxyethyl acetoacetate; and β-diketones, such as acetylacetone, 2,4-hexanedione, 2,4-heptanedione, 3,5-heptanedione, and dipivaloylmethane. The use amount of the nucleophilic reagent is preferably from 0.1 mol to 10 mol, more preferably from 1 mol to 4 mol with respect to the total amount of 1 mol of the alkoxide compound represented by the general formula (1) and the other precursor.

The thin-film forming raw material of the present invention is prevented from containing impurities except the alkoxide compound represented by the general formula (1), the other precursor, the organic solvent, and the nucleophilic reagent, such as impurity metal elements, impurity halogens including impurity chlorine, and impurity organic substances, to the extent possible. The content of each of the impurity metal elements is preferably 100 ppb or less, more preferably 10 ppb or less, and the total content thereof is preferably 1 ppm or less, more preferably 100 ppb or less. In particular, when the raw material is used as a gate insulating film, a gate film, or a barrier layer of an LSI, it is required to reduce the contents of alkali metal elements and alkaline-earth metal elements that influence the electrical characteristics of a thin-film to be obtained. The content of the impurity halogens is preferably 100 ppm or less, more preferably 10 ppm or less, most preferably 1 ppm or less. The total content of the impurity organic substances is preferably 500 ppm or less, more preferably 50 ppm or less, most preferably 10 ppm or less.

In addition, it is preferred that the thin-film forming raw material of the present invention be prevented from containing particles to the extent possible in order to reduce or prevent particle contamination of a thin-film to be formed. Specifically, in particle measurement with a light scattering liquid particle detector in a liquid phase, it is preferred that the number of particles larger than 0.3 μm be 100 or less in 1 mL of the liquid phase, it is more preferred that the number of particles larger than 0.2 μm be 1,000 or less in 1 mL of the liquid phase, and it is most preferred that the number of particles larger than 0.2 μm be 100 or less in 1 mL of the liquid phase.

Moisture in the thin-film forming raw material of the present invention is responsible for the occurrence of particles in the thin-film forming raw material of the present invention or during thin-film formation, and hence its content is preferably 10 ppm or less, more preferably 1 ppm or less. Accordingly, moisture is desirably removed from the alkoxide compound represented by the general formula (1), the other precursor, the organic solvent, and the nucleophilic reagent to be used in the thin-film forming raw material of the present invention in advance to the extent possible.

A method of producing a thin-film of the present invention is a method of producing a thin-film containing a tin atom on the surface of a substrate by an ALD method, and is characterized by including using the above-mentioned thin-film forming raw material, which is used in an atomic layer deposition method. The ALD method typically includes: a raw material introduction step of introducing the thin-film forming raw material into a film formation chamber in which the substrate is placed; a precursor thin-film formation step of depositing the thin-film forming raw material on the surface of the substrate to form a precursor thin-film; and a metal-containing thin-film formation step of causing the precursor thin-film on the surface of the substrate to react with a reactive gas to form a thin-film containing a metal atom on the surface of the substrate. The method of producing a thin-film of the present invention is described in detail below.

[Raw Material Introduction Step]

The raw material introduction step is a step of introducing the thin-film forming raw material of the present invention into the film formation chamber in which the substrate is placed. A method of introducing the thin-film forming raw material of the present invention into the film formation chamber may be a gas transportation method including performing heating and/or decompression in a container in which the thin-film forming raw material is stored (hereinafter sometimes simply described as "raw material container") to vaporize the raw material into vapor, and introducing the vapor into the film formation chamber in which the substrate is placed together with a carrier gas, such as argon, nitrogen, or helium, to be used as required, or may be a liquid transportation method including transporting the thin-film forming raw material of the present invention in a liquid or solution state to a vaporization chamber, performing heating and/or decompression in the vaporization chamber to vaporize the raw material into vapor, and introducing the vapor into the film formation chamber. A temperature and a pressure when the thin-film forming raw material of the present invention is turned into the vapor are preferably from 0° C. to 200° C. and from 1 Pa to 10,000 Pa, respectively.

A multi-component ALD method by which a thin-film containing two or more metal species, or a thin-film containing a metal species and silicon is formed comes in a cocktail source method including mixing the respective precursors, vaporizing the mixture, and introducing the resultant vapor into the film formation chamber, and a single source method including vaporizing each of the precursors independently and introducing the resultant vapor into the film formation chamber, and precursors similar to each other in behavior of thermal decomposition and/or oxidative decomposition are selected as the precursors to be used. In the case of the cocktail source method, the thin-film forming raw material of the present invention containing the other precursor only needs to be used, and in the case of the single source method, the thin-film forming raw material of the present invention free of the other precursor and a thin-film forming raw material containing the other precursor only need to be used.

The substrate on which the thin-film containing a tin atom is to be formed is placed in the film formation chamber into which the vapor obtained by vaporizing the thin-film forming raw material of the present invention is introduced. As a material for the substrate, there are given, for example: silicon; ceramics, such as silicon nitride, titanium nitride, tantalum nitride, titanium oxide, titanium nitride, ruthenium oxide, zirconium oxide, hafnium oxide, and lanthanum oxide; glass; and metals, such as metal cobalt. The shape of the substrate is, for example, a plate shape, a spherical shape, a fibrous shape, or a scaly shape. The surface of the substrate may be planar, or may have a three-dimensional structure, such as a trench structure.

[Precursor Thin-Film Formation Step]

The precursor thin-film formation step is a step of depositing the thin-film forming raw material on the surface of the substrate to form the precursor thin-film. The vapor of the precursor introduced into the film formation chamber is deposited on the surface of the substrate to form the precursor thin-film on the surface of the substrate. A pressure in the film formation chamber is preferably from 1 Pa to 10,000 Pa, more preferably from 10 Pa to 1,000 Pa. In addition, the temperature of the substrate is preferably from room temperature to 500° C., more preferably from 100° C. to 400° C., and the substrate or the film formation chamber may be heated so that the temperature may fall within the ranges. When the precursor thin-film formation step and the metal-containing thin-film formation step are continuously performed, the temperature of the substrate in the precursor thin-film formation step may be set to be equal to the temperature of the substrate in the metal-containing thin-film formation step to be described later. When the thickness of the precursor thin-film is excessively large, the reaction between the precursor thin-film and the reactive gas in the metal-containing thin-film formation step becomes insufficient. Accordingly, the thickness only needs to be adjusted in consideration of, for example, the reactivity of the reactive gas and reaction conditions.

[Metal-Containing Thin-Film Formation Step]

The metal-containing thin-film formation step is a step of causing the precursor thin-film on the surface of the substrate to react with the reactive gas to form the thin-film containing a metal atom on the surface of the substrate. Examples of the reactive gas include: oxidizing gases, including oxygen, ozone, nitrogen dioxide, nitrogen monoxide, water vapor, hydrogen peroxide, formic acid, acetic acid, and acetic anhydride; reducing gases, including hydrogen; and nitriding gases, including organic amine compounds, such as a monoalkylamine, a dialkylamine, a trialkylamine, and an alkylenediamine, hydrazine, and ammonia. Those reactive gases are selected in consideration of, for example, the kind of the thin-film to be formed, reactivity, and the ALD window. Those reactive gases may be used alone or as a mixture thereof. The alkoxide compound represented by the general formula (1) has a property of specifically reacting with an oxidizing gas at low temperature, and particularly satisfactorily reacts with water vapor. Accordingly, when the thin-film containing a tin atom to be formed is a tin oxide thin-film, a reactive gas containing water vapor is preferably used because a high-quality thin-film containing a small amount of residual carbon therein can be produced with high productivity.

The temperature of the substrate in the metal-containing thin-film formation step only needs to be set in consideration of, for example, the reactivity of the reactive gas to be used, the ALD window, and the thickness of the precursor thin-film. For example, the ALD window when an oxidizing gas is used as the reactive gas ranges from about 100° C. to about 300° C., and hence the temperature of the substrate only needs to be set within the range in consideration of the productivity of the thin-film.

The above-mentioned production method provides the thin-film containing a tin atom. However, when the film thickness of the thin-film does not reach a desired value, the following may be performed: the raw material introduction step, the precursor thin-film formation step, and the metal-containing thin-film formation step are regarded as one cycle, and the cycle is repeated a plurality of times until the desired film thickness is obtained. In each step, vapor or a by-product gas is produced, and any such gas may have an adverse effect in a subsequent step. Accordingly, an evacuation step for the removal of the vapor or the by-product gas from the film formation chamber may be performed. As an evacuation method, there are given, for example, a method involving purging the inside of the system with an inert gas, such as nitrogen, helium, and argon, a method involving performing evacuation by decompressing the inside of the system, and a combination of these methods. The decompression degree when decompression is performed is preferably from 0.01 Pa to 300 Pa, more preferably from 0.01 Pa to 100 Pa.

In the method of producing a thin-film of the present invention, energy, such as plasma, light, or a voltage, may be applied, and a catalyst may be used. There is no particular limitation on the timing for applying the energy and the timing for using the catalyst. The energy may be applied or the catalyst may be used, for example, at the time of introducing the vapor of the thin-film forming raw material in the raw material introduction step, at the time of heating in the precursor thin-film formation step or the metal-containing thin-film formation step, at the time of evacuating the inside of the system in the evacuation step, or at the time of introducing the reactive gas in the metal-containing thin-film formation step, or between the above-mentioned respective steps.

In addition, after the thin-film formation, the thin-film obtained by the method of producing a thin-film of the present invention may be subjected to annealing treatment in an inert atmosphere, an oxidizing atmosphere, or a reducing atmosphere in order to obtain more satisfactory electrical characteristics. When step embedding is required, a reflow step may be provided. The temperature in this case is from 200° C. to 1,000° C., preferably from 250° C. to 500° C.

Figure 1:
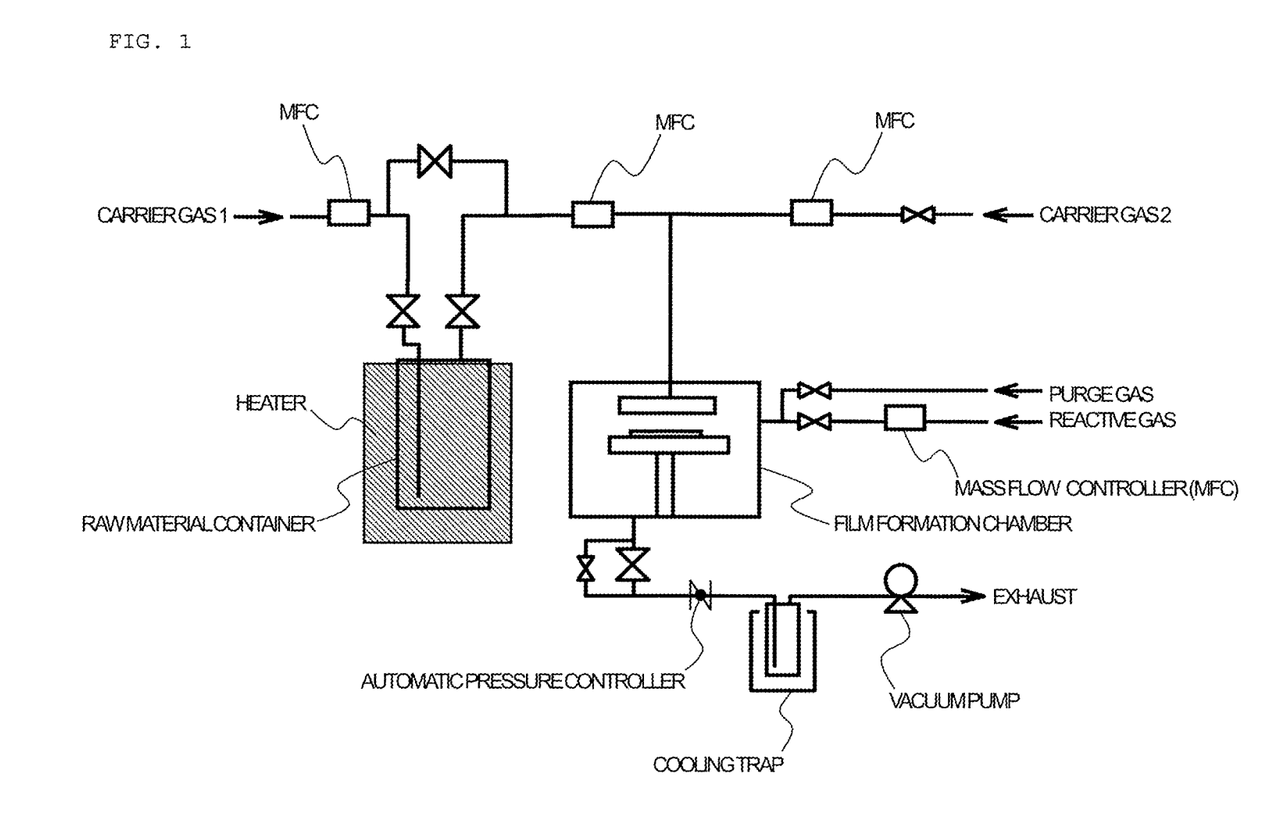
FIG. 1 is a schematic diagram for illustrating an example of an apparatus for an atomic layer deposition method to be used in a method of producing a thin-film according to the present invention.
Figure 2:
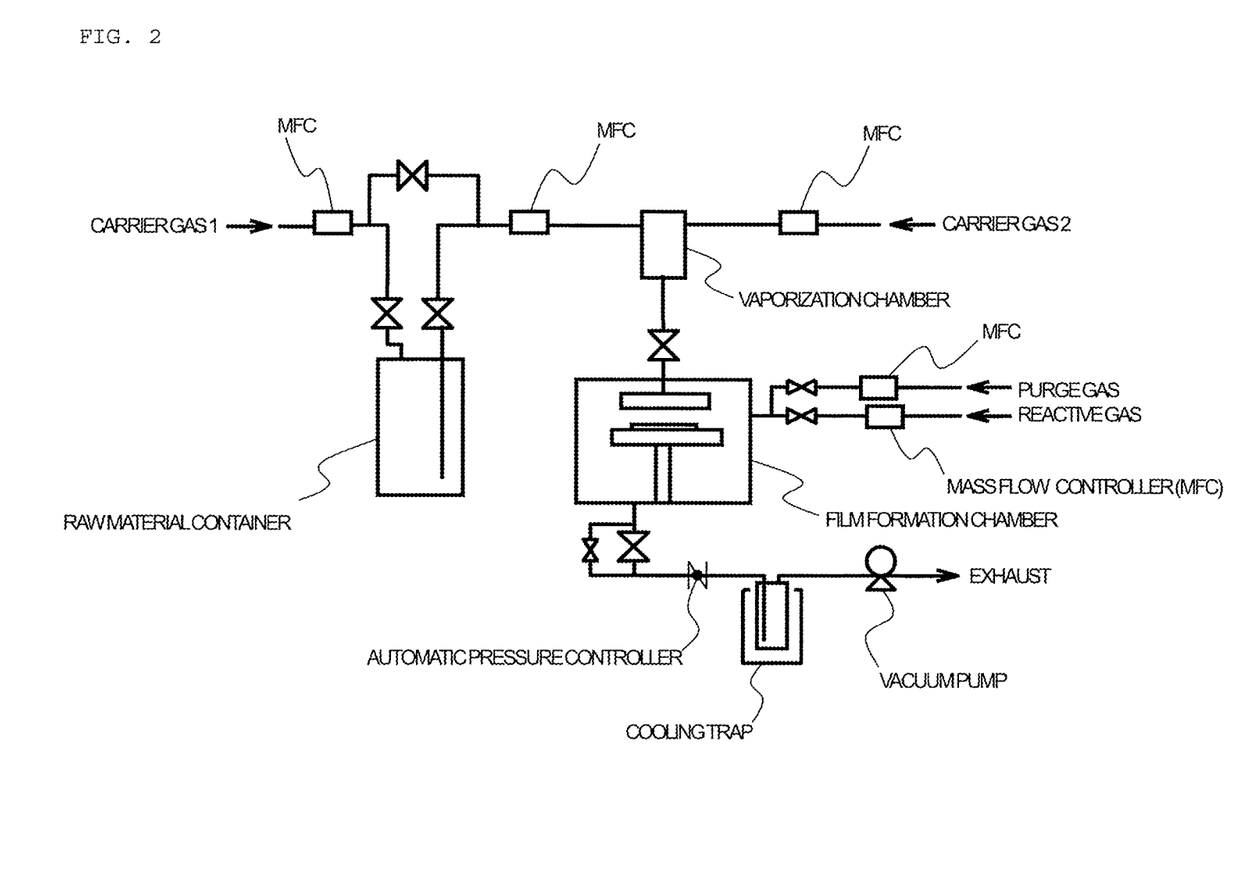
FIG. 2 is a schematic diagram for illustrating another example of the apparatus for an atomic layer deposition method to be used in the method of producing a thin-film according to the present invention.
Figure 3:
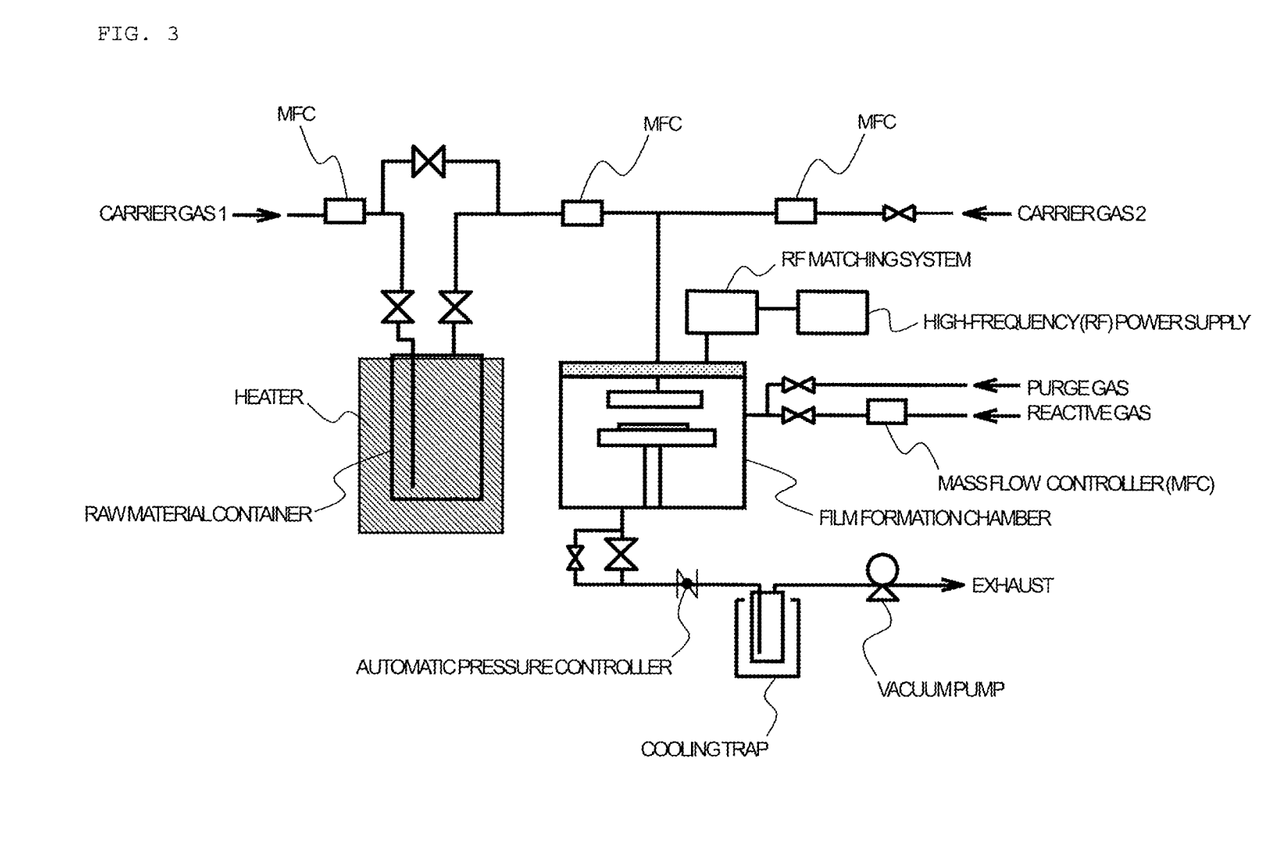
FIG. 3 is a schematic diagram for illustrating still another example of the apparatus for an atomic layer deposition method to be used in the method of producing a thin-film according to the present invention.
Figure 4:
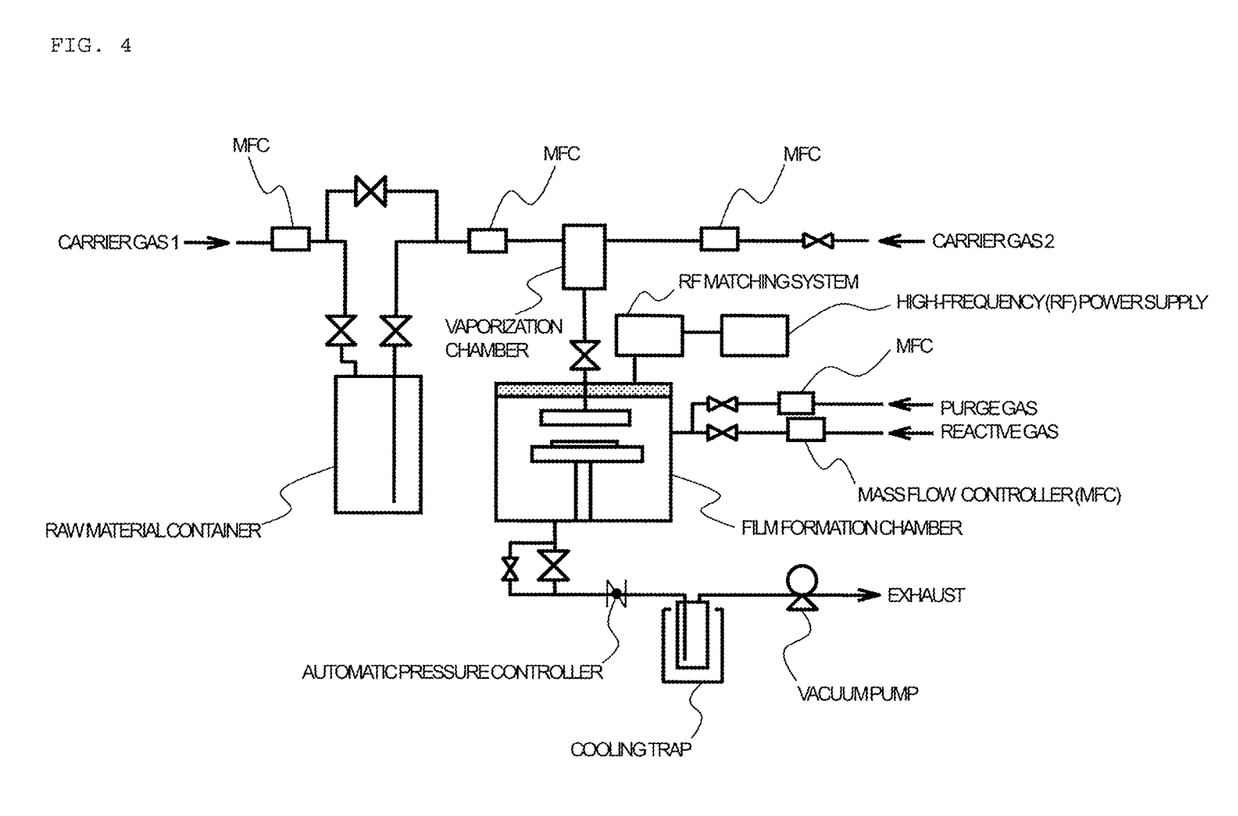
FIG. 4 is a schematic diagram for illustrating yet still another example of the apparatus for an atomic layer deposition method to be used in the method of producing a thin-film according to the present invention.

As an apparatus for producing a thin-film through use of the thin-film forming raw material, which is used in an atomic layer deposition method, of the present invention, a well-known apparatus for an atomic layer deposition method may be used. As specific examples of the apparatus, there are given an apparatus capable of performing bubbling supply of a precursor as illustrated in FIG. 1 and an apparatus including a vaporization chamber as illustrated in FIG. 2. In addition, there is given an apparatus capable of subjecting the reactive gas to plasma treatment as illustrated in FIG. 3 and FIG. 4. The apparatus is not limited to single-substrate type apparatus as illustrated in FIG. 1 to FIG. 4, and an apparatus capable of simultaneously processing a large number of substrates through use of a batch furnace may also be used.

An alkoxide compound represented by the general formula (2) is a novel compound. In the general formula (2), $R^4$ to $R^6$ each independently represent an alkyl group having 1 to 5 carbon atoms, provided that the total number of carbon atoms of $R^4$ to $R^6$ is from 4 to 8. Examples of the alkyl group having 1 to 5 carbon atoms include the alkyl groups listed for $R^1$ to $R^3$ in the general formula (1). $z^2$ represents an integer of from 1 to 3. The alkoxide compound represented by the general formula (2) may be produced by the same method as that of the alkoxide compound represented by the general formula (1).

EXAMPLES

Now, the present invention is described in more detail by way of Synthesis Examples, Examples, and Comparative Example. However, the present invention is not limited to the following Examples and the like.

[Synthesis Example 1] Synthesis of Compound No. 1

1.53 Grams (6.78 mmol) of tin(II) chloride dihydrate and 1.44 g (13.6 mmol) of trimethyl orthoformate were loaded into a 100-milliliter three-necked flask, and were stirred under room temperature for 1 hour. 50 Milliliters of methanol was loaded into the flask, and a solution obtained by diluting 2.62 g (28% methanol solution, 13.6 mmol) of sodium methoxide with 2.5 mL of methanol was dropped into the flask under room temperature. After the completion of the dropping, the mixture was stirred under room temperature for 2 hours. Next, 1.33 g (14.9 mmol) of 2-dimethylamino-1-ethanol was dropped into the flask under room temperature. After the completion of the dropping, the mixture was stirred under room temperature for 20 hours. The solvent was removed at a bath temperature of 77° C. under reduced pressure. 50 Milliliters of toluene was added to the resultant residue, and the mixture was stirred, followed by filtration. The solvent was removed at a bath temperature of 92° C. under reduced pressure, and the resultant pale yellow liquid was distilled under the conditions of 119° C. and 38 Pa to provide a target product that was a colorless and transparent liquid (solidified by air cooling, melting point: 53° C.). The yield and percent yield of the target product were 1.49 g and 75%, respectively.

(Analytic Values)
(1) Normal-Pressure TG-DTA
  50% mass loss temperature: 205° C. (760 Torr, Ar flow rate: 100 mL/min, temperature increase: 10° C./min)
(2) Reduced-Pressure TG-DTA
  50% mass loss temperature: 110° C. (10 Torr, Ar flow rate: 50 mL/min, temperature increase: 10° C./min)
(3) $^1$H-NMR (Deuterated Benzene)
  2.09 ppm (6H, broad), 2.34 ppm (2H, broad), 4.25 ppm (2H, broad)
(4) Elemental Analysis (Theoretical Values)
  C: 32.7 mass % (32.58 mass %), H: 6.9 mass % (6.83 mass %), O: 10.7 mass % (10.85 mass %), N: 9.6 mass % (9.50 mass %), Sn: 40.1 mass % (40.24 mass %)

[Synthesis Example 2] Synthesis of Compound No. 4

32.5 Grams (0.0740 mol) of bis(bis(trimethylsilyl)amino)tin(II) and 145 mL of hexane were loaded into a 500-milliliter four-necked flask. Next, 16.0 g (0.155 mol) of 1-(dimethylamino)-2-propanol was dropped into the flask under ice cooling. After the completion of the dropping, the mixture was stirred under room temperature for 19 hours. The solvent was removed at a bath temperature of 75° C. under reduced pressure, and the resultant crystal was sublimated under the conditions of 85° C. and 40 Pa to provide a target product that was a colorless crystal (melting point: 77° C.). The yield and percent yield of the target product were 22.7 g and 95%, respectively.

(Analytic Values)

(1) Normal-Pressure TG-DTA

50% mass loss temperature: 168° C. (760 Torr, Ar flow rate: 100 mL/min, temperature increase: 10° C./min)

(2) Reduced-Pressure TG-DTA

50% mass loss temperature: 93° C. (10 Torr, Ar flow rate: 50 mL/min, temperature increase: 10° C./min)

(3) $^1$H-NMR (Deuterated Benzene)

1.30-1.32 ppm (3H, doublet), 1.80-2.66 ppm (8H), 4.22-4.33 ppm (1H, broad)

(4) Elemental Analysis (Theoretical Values)

C: 37.3 mass % (37.18 mass %), H: 7.6 mass % (7.49 mass %), O: 9.7 mass % (9.91 mass %), N: 8.6 mass % (8.67 mass %), Sn: 36.8 mass % (36.75 mass %)

[Synthesis Example 3] Synthesis of Compound No. 7

19.3 Grams (0.0855 mol) of tin(II) chloride dihydrate and 18.1 g (0.171 mol) of trimethyl orthoformate were loaded into a 500-milliliter four-necked flask, and 200 mL of methanol was added to the mixture, followed by stirring under room temperature for 1 hour. 33.0 Grams (28% methanol solution, 0.171 mol) of sodium methoxide was dropped into the flask under ice cooling, and the mixture was stirred under ice cooling for 0.5 hour. Next, 22.0 g (0.188 mol) of 1-dimethylamino-2-butanol was dropped into the flask under ice cooling. After the completion of the dropping, the mixture was stirred under room temperature for 2.5 hours, and was then stirred at a bath temperature of 50° C. for 4 hours. The solvent was removed at a bath temperature of 90° C. under reduced pressure. 200 Milliliters of toluene was added to the resultant residue, and the mixture was stirred, followed by filtration. The solvent was removed at a bath temperature of 100° C. under reduced pressure, and the resultant pale yellow liquid was distilled under the conditions of 110° C. and 40 Pa to provide a target product that was a colorless and transparent liquid (melting point: 39° C.). The yield and percent yield of the target product were 16.0 g and 53%, respectively.

(Analytic Values)

(1) Normal-Pressure TG-DTA

50% mass loss temperature: 186° C. (760 Torr, Ar flow rate: 100 mL/min, temperature increase: 10° C./min)

(2) Reduced-Pressure TG-DTA

50% mass loss temperature: 108° C. (10 Torr, Ar flow rate: 50 mL/min, temperature increase: 10° C./min)

(3) $^1$H-NMR (Deuterated Benzene)

1.17-1.21 ppm (3H, triplet), 1.41-1.58 ppm (2H, multiplet), 1.80-2.33 ppm (7H), 2.59-2.64 ppm (1H, triplet), 3.88-3.95 ppm (1H, multiplet)

(4) Elemental Analysis (Theoretical Values)

C: 41.2 mass % (41.05 mass %), H: 8.2 mass % (8.04 mass %), O: 8.9 mass % (9.12 mass %), N: 8.0 mass % (7.98 mass %), Sn: 33.7 mass % (33.81 mass %)

[Example 1] Production of Tin Oxide Thin-Film

A tin oxide thin-film was produced on a silicon wafer by the ALD method under the following conditions through use of the apparatus illustrated in FIG. 1 with Compound No. 1 being used as a thin-film forming raw material, which is used in an atomic layer deposition method. When the composition of the obtained thin-film was checked by X-ray photoelectron spectroscopy, the obtained thin-film was tin oxide, and the residual carbon content was 3.5 atom %. In addition, when the film thickness was measured by a scanning electron microscopic method, and the average value thereof was calculated, the average film thickness was 52.0 nm, and the average film thickness obtained per cycle was 0.052 nm. It was recognized that the ALD window of Compound No. 1 ranged from 150° C. to 250° C.

(Conditions)

Substrate: silicon wafer, reaction temperature (silicon wafer temperature): 200° C., reactive gas: water vapor A series of steps including the following (1) to (4) was defined as one cycle, and this cycle was repeated 1,000 times.

(1) A raw material, which is used in an atomic layer deposition method, vaporized under the conditions of a raw material container temperature of 70° C. and a raw material container internal pressure of 100 Pa is introduced into a film formation chamber and deposited at a system pressure of 100 Pa for 10 seconds.

(2) The raw material, which is used in an atomic layer deposition method, which has not been deposited is removed through argon purging for 15 seconds.

(3) A reactive gas is introduced into the film formation chamber and subjected to a reaction at a system pressure of 100 Pa for 0.1 second.

(4) An unreacted reactive gas and a by-product gas are removed through argon purging for 90 seconds.

[Example 2] Production of Tin Oxide Thin-Film

A tin oxide thin-film was produced under the same conditions as those of Example 1 except that Compound No. 4 was used as a thin-film forming raw material, which was used in an atomic layer deposition method. When the composition of the obtained thin-film was checked by X-ray photoelectron spectroscopy, the obtained thin-film was tin oxide, and the residual carbon content was less than 1.0 atom %. In addition, when the film thickness was measured by a scanning electron microscopic method, and the average value thereof was calculated, the average film thickness was 10.0 nm, and the average film thickness obtained per cycle was 0.010 nm. It was recognized that the ALD window of Compound No. 4 ranged from 100° C. to 250° C.

[Example 3] Production of Tin Oxide Thin-Film

A tin oxide thin-film was produced under the same conditions as those of Example 1 except that Compound No. 7 was used as a thin-film forming raw material, which was used in an atomic layer deposition method. When the composition of the obtained thin-film was checked by X-ray photoelectron spectroscopy, the obtained thin-film was tin oxide, and the residual carbon content was less than 1.0 atom %. In addition, when the film thickness was measured by a scanning electron microscopic method, and the average value thereof was calculated, the average film thickness was 14.0 nm, and the average film thickness obtained per cycle was 0.014 nm. It was recognized that the ALD window of Compound No. 7 ranged from 100° C. to 250° C.

[Comparative Example 1] Production of Tin Oxide Thin-Film

A tin oxide thin-film was produced under the same conditions as those of Example 1 except that the following Comparative Compound 1 was used as a thin-film forming raw material, which was used in an atomic layer deposition method. When the composition of the obtained thin-film was checked by X-ray photoelectron spectroscopy, the obtained thin-film was tin oxide, and the residual carbon content was 10.0 atom %. In addition, when the film thickness was measured by a scanning electron microscopic method, and the average value thereof was calculated, the average film thickness was 5.0 nm, and the average film thickness obtained per cycle was 0.005 nm. It was recognized that the ALD window of Comparative Compound 1 ranged from 100° C. to 150° C.

Comparative Compound 1

The results of Examples 1 to 3 showed that in each of Examples, a high-quality tin oxide thin-film having a low residual carbon content was able to be produced. It was found that in Example 1 out of Examples, the film thickness obtained per cycle was large, and hence a thin-film was able to be obtained with high productivity. In addition, it was found that in each of Examples 2 and 3, an extremely high-quality tin oxide thin-film having an extremely low residual carbon content was able to be obtained. Meanwhile, as can be seen from the results of Comparative Example 1, when Comparative Compound 1 having a structure similar to those of Examples 1 to 3 was used, the film thickness obtained per cycle was extremely small as compared to those of Examples 1 to 3, and hence a low-quality thin-film having an extremely high residual carbon content was obtained. In addition, it was found that the width of the ALD window of Compound No. 1 was about 100° C., and the width of the ALD window of each of Compound No. 4 and Compound No. 7 was about 150° C. Meanwhile, it was found that the width of the ALD window of Comparative Compound 1 was about 50° C., and hence it was difficult to use Comparative Compound 1 as a thin-film forming raw material, which was used in an atomic layer deposition method.

The foregoing results showed that according to the present invention, a high-quality tin oxide thin-film was able to be produced by the ALD method with high productivity.

The invention claimed is:

1. A thin-film forming raw material, which is used in an atomic layer deposition method, comprising an alkoxide compound represented by the following general formula (1):

where $R^1$ represents a hydrogen atom or an alkyl group having 1 to 5 carbon atoms, $R^2$ and $R^3$ each independently represent an alkyl group having 1 to 5 carbon atoms, and $z^1$ represents an integer of from 1 to 3.

2. A method of producing a thin-film containing a tin atom on a surface of a substrate by an atomic layer deposition method, the method comprising the steps of:
vaporizing the thin-film forming raw material of claim 1, which is used in an atomic layer deposition method, followed by deposition of the raw material on the surface of the substrate to form a precursor thin-film; and
causing the precursor thin-film to react with a reactive gas to form the thin-film containing a tin atom on the surface of the substrate.

* * * * *